United States Patent [19]

Beasom

[11] 3,986,904
[45] Oct. 19, 1976

[54] PROCESS FOR FABRICATING PLANAR SCR STRUCTURE

[75] Inventor: James D. Beasom, Indian Harbour Beach, Fla.

[73] Assignee: Harris Corporation, Cleveland, Ohio

[22] Filed: July 21, 1972

[21] Appl. No.: 273,800

[52] U.S. Cl. .................................. 148/187; 357/38
[51] Int. Cl.² ....................................... H01L 21/22
[58] Field of Search ................... 317/235; 307/905

[56] References Cited
UNITED STATES PATENTS

| 3,460,006 | 8/1969 | Strull | 317/235 |
| 3,489,961 | 1/1970 | Frescura et al. | 317/235 |
| 3,575,646 | 4/1971 | Karcher | 317/235 |

Primary Examiner—L. Dewayne Rutledge
Assistant Examiner—J. M. Davis

[57] ABSTRACT

A low resistivity anode region is formed relative to the much higher resistivity gate region in a planar semiconductor controlled rectifier (SCR) structure. The low resistivity anode region is achieved by diffusing an appropriate impurity in high concentration in a distinct diffusion step separate from the diffusion of the like conductivity type gate region. The result is a desirable optimization of certain device parameters, viz., $r_{on}$ and $V_f$.

6 Claims, 2 Drawing Figures

PROCESS FOR FABRICATING PLANAR SCR STRUCTURE

BACKGROUND OF THE INVENTION

The present invention relates generally to semiconductor controlled rectifiers, and more particularly to the fabrication of planar semiconductor controlled rectifiers with the aim of minimizing the device parameters $r_{on}$ and $V_f$, and thereby increasing the yield of acceptable devices.

PRIOR ART

Typically, it has been the practice heretofore to fabricate the anode region at the same time as the gate region in planar SCR structures, by simultaneous diffusion of the same impurity into the basic single crystal silicon body, since both of these regions are of the same conductivity type. The anode and gate regions are of substantially higher resistivity than the opposite conductivity type cathode region, which is formed within the gate region.

SUMMARY OF THE INVENTION

I have found that a substantial increase in yield, i.e., the number of devices in any given batch which after test display acceptable operating characteristics and parameters, may be achieved for planar SCR structures by minimizing the device parameters $r_{on}$ and $V_f$. In turn, the desired minimization of these parameters is obtained in accordance with my invention by diffusion of a high concentration of impurities to form a low resistivity anode region in a separate and distinct step from the diffusion of the same impurities in lower concentration to form like conductivity type but higher resistivity gate region. The low resistivity cathode region is within the gate region.

Accordingly, it is a principal object to provide a planar semiconductor controlled rectifier having minimum $r_{on}$ and $V_f$.

A related object is to provide a method of fabricating such a controlled rectifier.

DETAILED DESCRIPTION OF THE INVENTION

Figure 1:
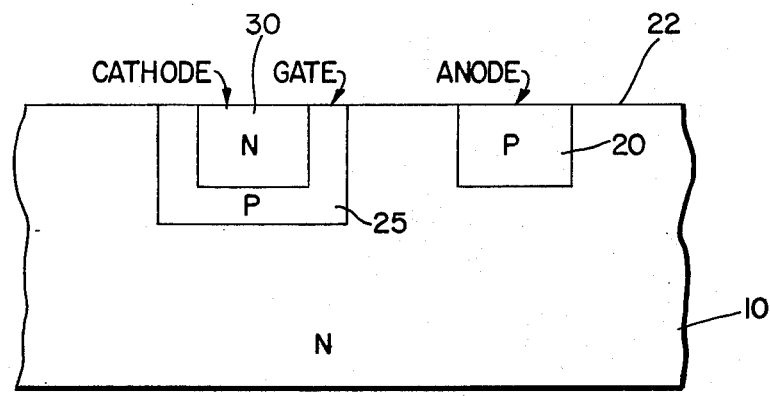
FIG. 1 is a sectional view illustrating the preferred embodiment of the controlled rectifier.

FIG. 1 depicts an embodiment of a planar semiconductor controlled rectifier fabricated within a body of single crystal semiconductor material 10, preferably N-type silicon. A P-region 20 constituting the anode of the SCR at the planar surface 22 of body 10 is spaced apart from a second P-region 25, the gate, within which an N-type cathode region 30 is formed. All of these regions are formed by conventional planar diffusion techniques, the formation of the cathode within the gate requiring the usual double diffusion. According to the invention the SCR is fabricated to minimize the bulk resistance of the anode and cathode, and thereby to achieve minimization of $V_f$ and $r_{on}$. $V_f$ is the anode to cathode voltage of the SCR in the "on" condition, and $r_{on}$ is the small signal resistance of the SCR in the "on" condition.

While SCR's of the present invention may be fabricated in any suitable body in which they are electrically isolated from one another and/or from other devices of an integrated circuit (IC), it is preferred that the devices be formed in single crystal silicon islands isolated from each other and from a polycrystalline silicon substrate by a thin dielectric layer (e.g., $SiO_2$). The process of producing such a structure is well known and, since it forms no part of the present invention, need not be discussed in further detail.

In the illustrative embodiment, each single crystal island 10 is N-type silicon doped to a resistivity of approximately 4 ohms-cm, and has a thickness of about 1 mil to an underlying buried layer (not shown) of 5 ohms per square (ohms/sQ.). The polycrystalline wafer containing the islands is cleaned and a 6000 A (6KA) layer of oxide is grown on its surface in a steam ambient at 1100° C, as a diffusion mask. A photoresist and oxide etch procedure is used to expose the planar surface 22 at the desired location of the gate region of each SCR. As is well known, in this procedure a photoresist layer is deposited on the oxide mask, the photoresist is exposed to light in accordance with the desired pattern, the pattern is developed to remove unexposed portions of the photoresist, and the thus-exposed portions of the oxide layer are removed with a suitable etchant.

The remaining photoresist is then removed by stripping to leave an oxide mask with windows for the subsequent gate deposition.

The wafer is then cleaned and processed through a conventional open tube deposition-diffusion sequence with a P-type dopant to form a 3.3 micron deep gate region 25 with a resistivity of 200 ohms per square in the gate location for each SCR. Preferably the P-type dopant is boron, but any other P-type dopant, such as gallium, which will controllably yield an approximately 200 ohms/sq gate region is acceptable. The boron surface impurity concentration is approximately $5 \times 10^{18}$ atoms/cc for such a resistivity.

During and following the diffusion of the gate region, silicon dioxide is regrown, thereby covering the gate windows and reforming a complete oxide layer.

Another photoresist and oxide etch procedure identical to that described above is performed to open windows at desired locations for diffusion of the anode region of each SCR. After cleaning the wafer, a conventional P-type deposition-diffusion procedure is performed to form an anode region 20 having a depth of 3 microns and a resistivity of 3 ohms/sq. Using a boron dopant, a surface concentration of approximately $5 \times 10^{20}$ atoms/cc is required for this resistivity. The wafer is then subject to oxidation at 1000° C. in a steam ambient to grow 4 KA of oxide over the windows through which the anode regions were diffused. It is important to note that the anode region 20 is diffused in an entirely separate step from the gate region diffusion, and with a substantially lower resistivity.

Another photoresist and oxide etch process is performed to provide windows for duffusing the cathode regions 30 for each SCR in the respective previously formed gate regions 25. A conventional N-type deposition-diffusion procedure is then performed to form 2.9 micron deep cathode regions of 1.5 ohms/sq. Preferably the N-type dopant is phosphorus but other N-type dopants, such as arsenic or antimony are also acceptable. A phosphorus dopant in a surface impurity concentration of approximately $1 \times 10^{21}$ atoms/cc provides the desired relatively low resistance of the cathode region. Thus, the anode region 20 and the cathode region 30 are both formed with very low resistivities.

The resistivity of the gate region is at least approximately two orders of magnitude greater.

Figure 2:
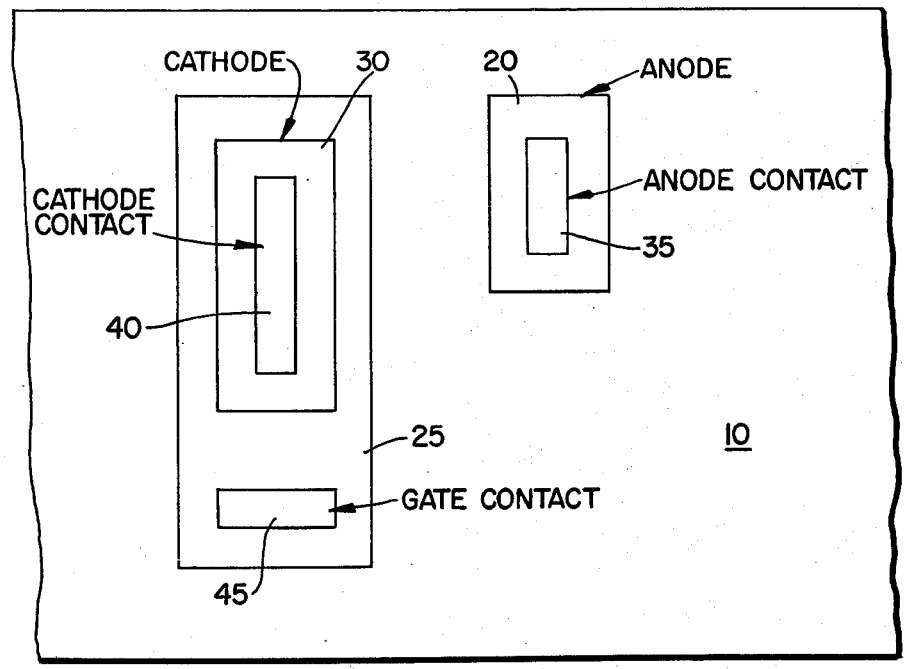
FIG. 2 is a view of the top surface of the structures of FIG. 1.

A photoresist and oxide etch procedure is now performed to expose the desired anode contact region 35, cathode contact region 40, and gate contact region 45. The wafer is then chemically cleaned and 50 microinches of aluminum is evaporated onto the wafer surface. A final photoresist and aluminum etch is performed to define contact metal to the gate, anode and cathode regions. The final topography is shown in FIG. 2. For the sake of simplicity and clarity, no contacts are shown in the section view of FIG. 1.

The wafers are baked for 20 hours at 300° C to complete the fabrication.

Although the present invention is described by way of example for fabrication in dielectrically isolated single crystal islands, the same basic process may be performed using epitaxial wafers or uniformly doped wafers with junction isolation.

It will also be apparent that all of the N and P region may be reversed without affecting the essence of the invention.

I claim:

1. A process for fabricating planar semiconductor controlled rectifiers, which comprises
    forming first and second spaced apart regions of like conductivity type at a planar surface of a single crystal semi-conductor body of opposite conductivity type, such that one of said first and second regions is of substantially greater resistivity than the other of said first and second regions, said one region constituting the gate region and said other region constituting the anode region of the controlled rectifier, and
    forming a cathode region of said opposite conductivity type with a resistivity substantially lower than the resistivity of said gate region within said gate region.
2. The process according to claim 1, wherein the resistivity of said gate region is at least approximately two orders of magnitude greater than the resistivity of either of said anode region and said cathode region.
3. A process for fabricating planar silicon controlled rectifiers, which comprises
    diffusing first conductivity-determining impurities into the planar surface of a body of single crystal silicon of opposite conductivity type in sufficiently low concentration to form a relatively high resistivity gate region therein,
    diffusing said first conductivity-determining impurities into said planar surface of said silicon body at a location spaced from said gate region, in sufficiently high concentration to form a relatively low resistivity anode region therein, and
    diffusing opposite conductivity-determining impurities into said planar surface of said silicon body within said gate region in sufficiently high concentration to form a relatively low resistivity cathode region therein.
4. The process according to claim 1, wherein said gate region has a resistivity of approximately 200 ohm per square, said anode region has a resistivity of approximately 3 ohms per square, and said cathode region has a resistivity of approximately 1.5 ohms per square.
5. The process according to claim 3, wherein the resistivity of said gate region is at least approximately two orders of magnitude greater than the resistivity of either of said anode region and said cathode region.
6. The process according to claim 3, wherein said gate region has a resistivity of approximately 200 ohms per square, said anode region has a resistivity of approximately 3 ohms per square, and said cathode region has a resistivity of approximately 1.5 ohms per square.

* * * * *